United States Patent [19]
Roscher et al.

[11] Patent Number: 5,923,609
[45] Date of Patent: Jul. 13, 1999

[54] STROBED WORDLINE DRIVER FOR FAST MEMORIES

[75] Inventors: Juergen John Roscher; Richard B. Friel, both of Chubbuck; Larry W. Petersen, Pocotello, all of Id.

[73] Assignee: American Microsystems, Inc., Pocatello, Id.

[21] Appl. No.: 08/933,159

[22] Filed: Sep. 18, 1997

[51] Int. Cl.$^6$ ........................ G11C 8/00
[52] U.S. Cl. ............... 365/230.06; 365/233.5; 365/194
[58] Field of Search ............ 365/230.06, 233.5, 365/230.01, 194

[56] References Cited

U.S. PATENT DOCUMENTS

| | | | |
|---|---|---|---|
| 5,161,121 | 11/1992 | Cho | 365/230.06 X |
| 5,265,057 | 11/1993 | Furuyama et al. | 365/230.06 X |
| 5,297,104 | 3/1994 | Nakashima | 365/230.06 |
| 5,495,448 | 2/1996 | Sachdev | 365/230.06 |
| 5,654,923 | 8/1997 | Mizobata et al. | 365/230.06 X |
| 5,719,818 | 2/1998 | Tovim et al. | 365/230.06 |

*Primary Examiner*—Huan Hoang
*Attorney, Agent, or Firm*—Skjerven Morrill Macpherson Franklin & Friel LLP; David E. Steuber

[57] ABSTRACT

A wordline driver for a semiconductor memory array having a circuit for selecting and deselecting the first end of an addressed wordline and a circuit for deselecting the second end of the addressed wordline. The first and second ends of the addressed wordline are deselected at substantially the same time. The first end of the wordline is selected and deselected responsive to a strobe waveform and the second end of the wordline is deselected responsive to an RL Strobe waveform. The RL Strobe waveform is derived from a delayed strobe waveform.

19 Claims, 5 Drawing Sheets

STROBED WORDLINE DRIVER FOR FAST MEMORIES

FIELD OF THE INVENTION

The present invention relates to semiconductor memories and, more specifically, to semiconductor memory arrays requiring a reduced time to deselect a wordline which has been addressed.

BACKGROUND OF THE INVENTION

Proper operation of a memory array requires that a currently selected wordline be fully deselected (pulling the voltage on the deselected wordline to a LOW) before the selection of a subsequently addressed wordline is made. Consequently, the less time it takes to deselect a previously accessed wordline, the faster the selection of the newly addressed wordline can be accomplished. If more than one wordline is in a selected state at any given time, the content of the data bus will be written into more than one location during the write operation. During the read operation, selection of more than one wordline will allow all the selected addresses to unload their contents, leading to erroneous results on the data bus, and rendering the memory device ineffective and useless.

Semiconductor memory chips generally have a relatively large number of memory cells which are organized into arrays of rows and columns. To select a particular cell in the array, an address which identifies both the column and the row to which the cell is connected must first be decoded.

In a memory array, all of the memory cells in a given row are connected to a single wordline which is pulled HIGH when one of the cells on that row is accessed and is pulled LOW when the access is terminated. The resulting RC load of the wordlines can significantly limit the performance of the memory by increasing the amount of time required to charge and discharge the wordlines during the selection and the deselection phase. Similarly, all the memory cells along a column are connected to the same pair of bitlines.

For many memory arrays, the time required for the deselection of a wordline is a major component of the delay contributing to the memory access time. Therefore, for these memory arrays, the faster a wordline can be pulled down to the deselected voltage level, the sooner another wordline can be selected so that valid data can be written to or read from the addressed cells. For certain applications, such as a cache memory on a microprocessor chip, very fast access times are a necessity in order for the system to take advantage of the high speed of the microprocessor. This makes it even more critical to have a memory circuit that deselects a wordline with a minimum amount of delay.

A row select circuit typically includes a decoder circuit and a driver circuit for each row (wordline) in the memory array. An array with $2^N$ rows requires an address input of N bits to select a row. Each decoder receives and decodes the N-bit address and in response thereto selects a particular row in the array. The driver circuit of the selected row drives the selected row (wordline), thus allowing a memory cell or cells on the selected row to be accessed (read from or written into). Before this occurs, all of the other rows in the array must be deselected.

Two basic types of wordline drivers have been used to drive the wordlines in a memory array. The first type is the three transistor wordline driver 100 shown in FIG. 1, which contains three MOS transistors 102, 104 and 106. A HIGH voltage on the RLB line (which is the inverse of the voltage on the RL line), turns on the n-channel transistor 106 and pulls the wordline to LOW ($V_{SS}$). When the voltage on line RL is HIGH, the wordline will either be pulled HIGH by p-channel transistor 102 if the voltage at node F is LOW, or it will be pulled LOW by n-channel transistor 104 if the voltage at node F is HIGH.

The disadvantages of the three transistor wordline driver are:

1. It is difficult to put three transistors on pitch with smaller wordline widths and spacings.
2. Too many interconnects are required. (The RL and RLB lines need to be run in every wordline driver.)
3. Because of the large time-constant (RC) of the wordline, an excessively long wordline pull-down time could result.

The second type of wordline driver is the strobed two-transistor wordline driver 200 shown in FIG. 2. The strobed two-transistor wordline driver is controlled by a strobe. An address transition detector (ATD) detects address changes and in response generates the STROBE signal. The STROBE terminates at the end of the cycle. The advantages of the strobed two-transistor wordline driver are:

1. There are fewer transistors to put on the wordline pitch.
2. There are fewer interconnects since there are no RLB lines.

The strobed two-transistor wordline driver suffers from a major disadvantage. The inherently large RC loading delay of the wordline results in a long selection and deselection time of the wordlines.

Hence a device and a method to more rapidly deselect an addressed wordline after a read or write operation has been completed is needed.

SUMMARY OF THE INVENTION

The present invention is directed to a wordline driver providing a fast deselection of an addressed wordline by pulling down the wordline to LOW from both ends at substantially the same time.

The wordline driver includes an Address Transition Detector, a Strobe Generation Logic, an Address Decode for Rows, a Wordline Select and a Wordline Deselect circuits. The Wordline Select controls the state of a first end of a wordline when selecting the wordline. The Wordline Deselect controls the state of the first end and a second end of the wordline when deselecting the wordline.

BRIEF DESCRIPTION OF THE DRAWINGS

The accompanying drawings illustrate the present invention and serve to explain the principles of the invention. In the drawings.

DETAILED DESCRIPTION

Figure 1:
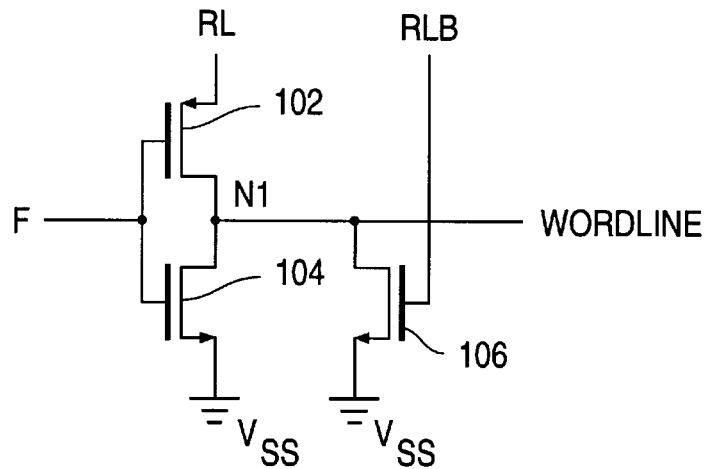
FIG. 1 shows a three-transistor wordline driver as known in the prior art.
Figure 2:
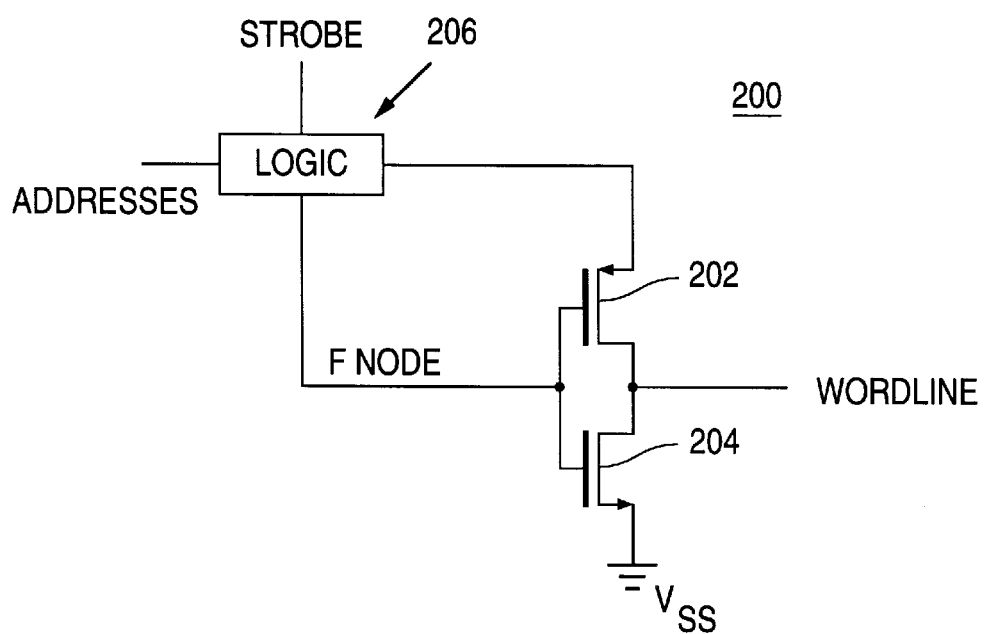
FIG. 2 shows a strobed two-transistor wordline driver as known in the prior art.
Figure 3:
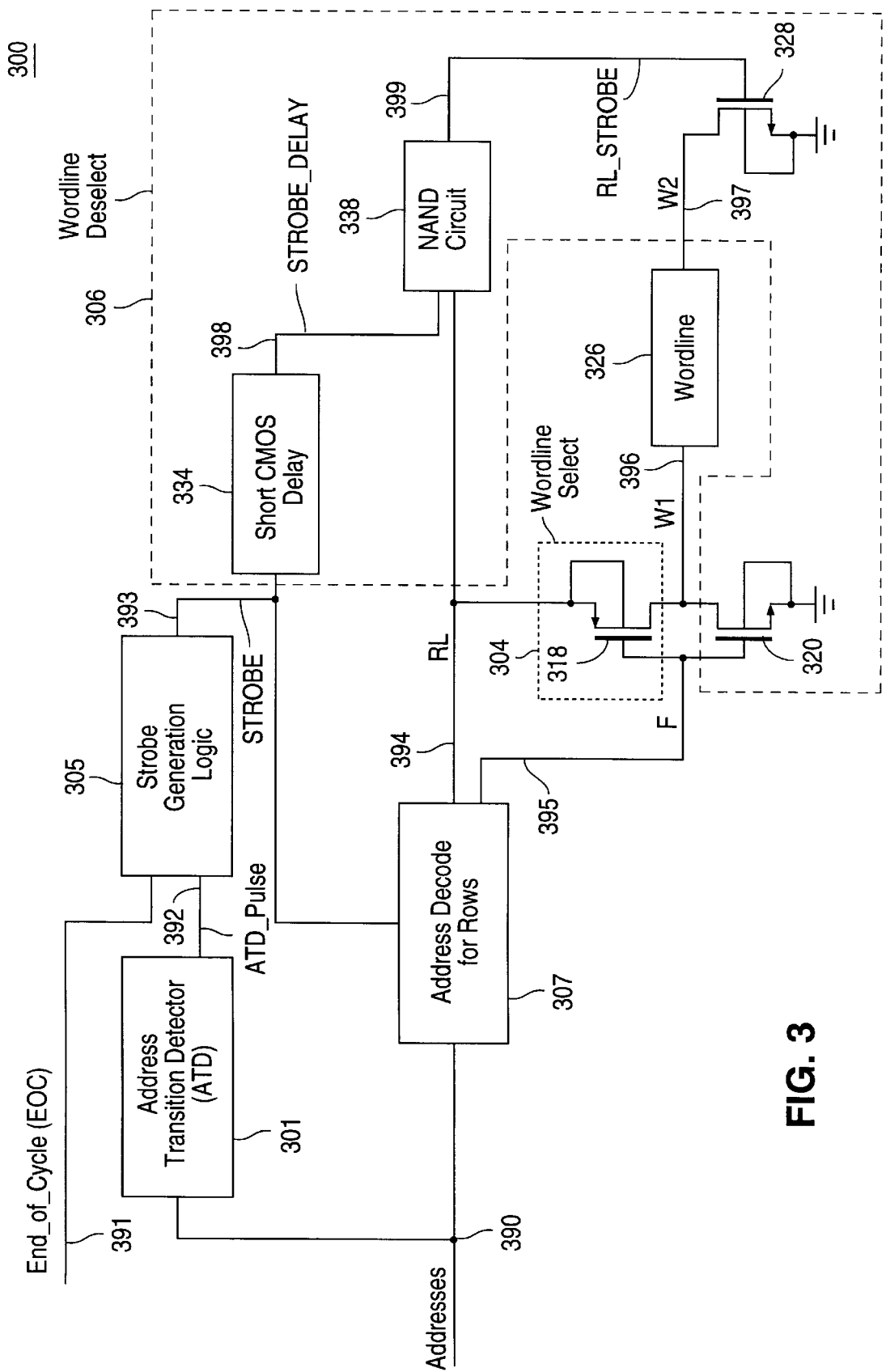
FIG. 3 shows a strobed three-transistor wordline driver in accordance with the present invention.

FIG. 3 shows the strobed three-transistor wordline driver 300 of the present invention.

The strobed three-transistor wordline driver 300 includes Wordline Select (WS) 304, Wordline Deselect (WD) 306, Address Transition Detector (ATD) 301, STROBE Generation Logic (SGL) 305, and Address Decode for Rows (ADFR) 307. Wordline driver 300 receives signals "Addresses" and "End_of_cycle" at its input terminals 390 and 391 and generates output signals "W1" and "W2" at its output terminals which are connected to nodes 396 and 397. Nodes 396 and 397 are connected to the two end points of wordline 326.

ATD 301 receives signal "Addresses" at input terminal 390 and generates output signal "ATD_pulse" at its output terminal which is connected to node 392. An "ATD_pulse" pulse indicates that a new cycle has started. The operation of the Address Transition Detector 301 is well known in the prior art. Upon a change in the logic state of any of the "addresses" input signals, ATD 301 issues an "ATD_pulse" signal at node 392.

SGL 305 has two input terminals and one output terminal. Input terminal 391 receives signal "End_of_cycle". The other input terminal which is connected to node 392 receives signal "ATD_pulse". SGL 305 generates output signal "STROBE" at its output terminal which is connected to node 393. Signal "ATD_pulse" is also applied to the "Reset" terminal of a SR Flip-Flop (not shown in FIG. 3) whose output terminal generates signal "End_of_cycle". The "Set" terminal of the SR Flip-Flop is driven by a signal (not shown in FIG. 3) that goes high when the data from the memory is read into the output latch. The operation of SGL 305 is as follows. When an "ATD_pulse" pulse signal arrives at node 392, signals "STROBE" and "End-of-cycle" go HIGH and LOW respectively and maintain their new states until the data from the memory is latched at the output, at which point SR Flip-Flop is set forcing signal "End_of_cycle" to go HIGH which in turn forces "STROBE" to go low.

ADFR 307 has two input terminals. Input terminal 390 receives signal "Addresses". The second input terminal of ADFR 307 is connected to node 393 for receiving "STROBE" signal generated at the output terminal of SGL 305. ADFR 307 generates output signals "RL" and "F" at its output terminals which are connected to nodes 394 and 395 respectively. When a particular wordline within the memory array is accessed by generating appropriate "Addresses" signals, the corresponding "RL" signal is pulled high, irrespective of the input signal "STROBE". Output signal "F" depends on both the "Addresses" and the "STROBE" signals. For any given wordline that is being accessed in the memory array signal "F" will be the inverse of signal "STROBE".

WS 304 includes a p-channel MOS transistor 318. WS 304 receives input signals "F" and "RL" at the gate and the source terminals of transistor 318 and generates output signal "W1" at the drain terminal of transistor 318, driving a first end of wordline 326 which is connected to node 396.

WD 306 includes n-channel MOS transistors 320 and 328, the delay circuit 334 and a NAND gate 338. Input terminals of WD 306 are connected to nodes 393 and 394 receiving signals "STROBE" and "RL" respectively. WD 306 generates output signals "W1" and "W2" at its output terminals which are connected to nodes 396 and 397. Stage 334 of WD 306 receives signal "STROBE" at its input terminal which is connected to node 393 and generates signal "STROBE_DELAY" at its output terminal which is connected to node 398. The input terminals of NAND gate 338 are connected to nodes 398 and 394 receiving signals "STROBE_DELAY" and "RL" respectively. NAND gate 338 generates signal "RL_STROBE" at its output terminal which is connected to node 399. Transistor 320 receives input signal "F" at its gate terminal which is connected to node 395. The drain and the source terminals of transistor 320 are connected to nodes 396 and ground respectively. Transistor 328 receives input signal "RL_STROBE" at its gate terminal which is connected to node 399. Transistor 328 generates signal "W2" at its drain terminal which is connected to a second end of wordline 326 at node 397. The source terminal of transistor 328 is connected to ground.

The procedure for selecting and deselecting a wordline is as follows. By placing the proper values on the address input terminals (generating the desired "Addresses" signals), Address Decode for Rows 307 causes signal "RL" to go HIGH. The address change also triggers ATD 301 to issue a LOW-to-HIGH "ATD_pulse" signal which in turn causes signal "STROBE" to go from LOW to HIGH and signal "End_of_cycle" to go from HIGH to LOW. As signal "STROBE" rises signal "F" falls, turning the p-channel transistor 318 on and turning n-channel transistor 320 off, which in turn pulls wordline 326 HIGH, hence selecting wordline 326. A LOW to HIGH change in signal "STROBE" is followed by signal "STROBE_DELAY" after a small delay. When both "STROBE_DELAY" and "RL" are HIGH, NAND gate 338 output causes signal "RL_STROBE" to go LOW thereby turning n-channel transistor 328 off. During the time that the wordline 326 remains HIGH, the data is read from the memory cell and latched at the output. The latching of the data at the output marks the termination of the read cycle, causing signal "End_of_cycle" to go HIGH which in turn causes signal "STROBE" to go LOW forcing signals "F" and "RL_STROBE" both to go HIGH, turning off p-channel transistor 318 while turning on both n-channel transistors 320 and 328. This will force the wordline 326 to go LOW from both ends, namely from nodes 396 and 397, giving rise to a fast deselection of wordline 326.

The short CMOS delay 334 serves two purposes. First, it ensures that both n-channel transistors 320 and 328, pulling down nodes 396 and 397 at the opposite ends of the wordline 326 are turned on simultaneously during wordline 326 deselection period. Secondly, the delay serves to ensure that no overlapping periods of on-time exist between p-channel pull-up transistor 318 and the n-channel pull-down transistor 328. The amount of delay is determined for the particular memory array. For example, in one embodiment a delay of one to two nanosecond was used.

Figure 4:
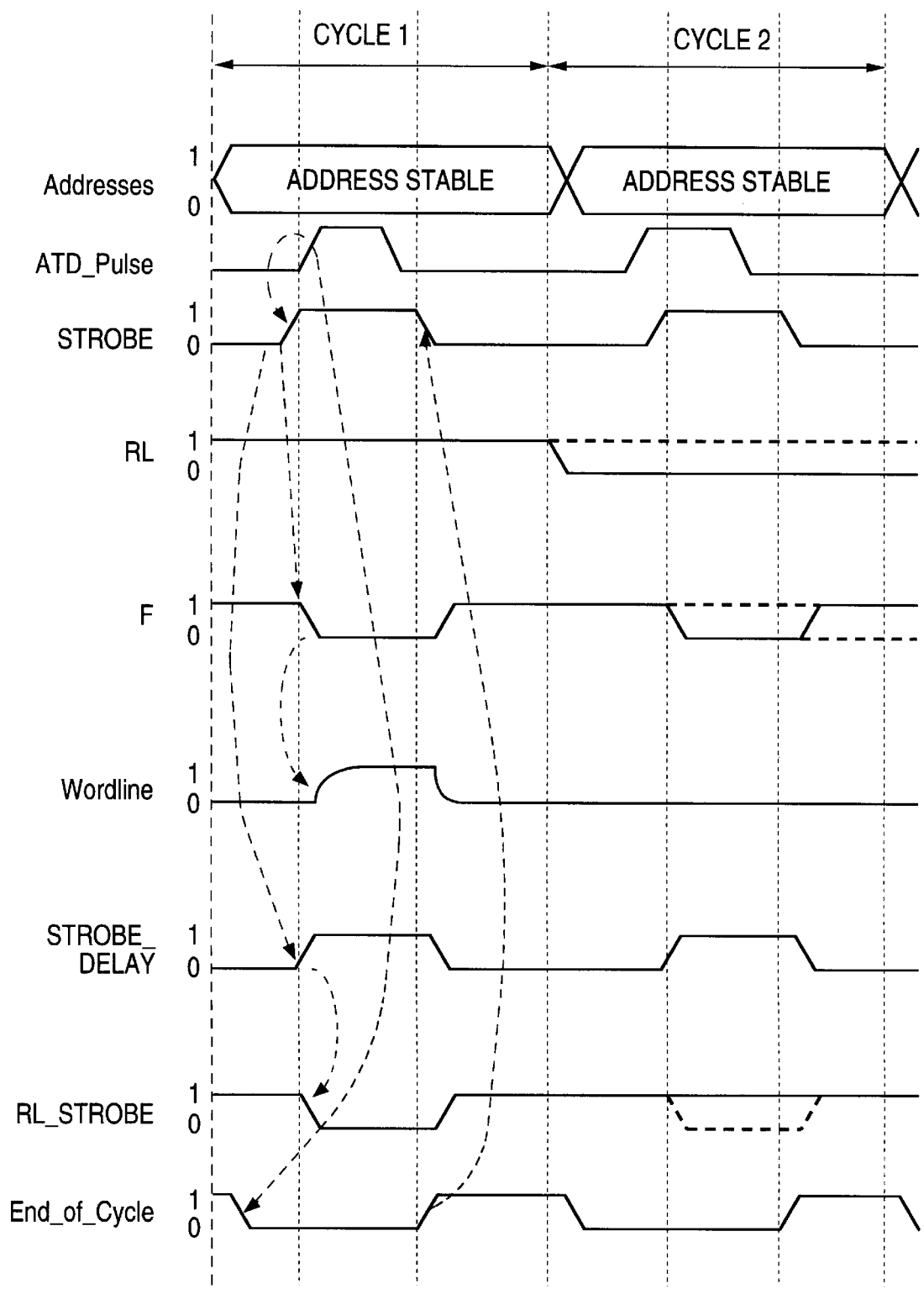
FIG. 4 is a waveform diagram for the strobed three-transistor wordline driver of the present invention.

FIG. 4 shows the waveform diagram for the strobed three-transistor wordline driver 300. During cycle 1, Address Decode for Rows 307 pulls signal "RL" HIGH. The address transition, responsible for the decoding of the "RL", when sensed by the ATD 301 forces signal "ATD_pulse" to go HIGH which in turn causes signals "STROBE" and "End_of_cycle" to go HIGH and LOW respectively. The rising "STROBE" signal forces signals "F" and "RL_STROBE" to go LOW, shutting off the path between wordline 326 and ground by turning off n-channel transistors 320 and 328 while turning on p-channel transistor 318 causing wordline 326 to be pulled HIGH, thereby selecting it. The voltage at Wordline 326 is delayed from reaching HIGH by the inherent resistance and capacitance (RC) of wordline 326. Wordline 326 RC varies with the number of memory cells connected to the wordline 326. Signal "STROBE" stays HIGH until signal "End_of_cycle" goes HIGH at which point "STROBE" goes LOW causing signal "F" to go HIGH. When signal "F" goes high p-channel transistor 318 turns off and n-channel transistor 320 turns on forcing wordline 326 to go LOW form node W1. At the same time as signal "STROBE" goes LOW signal "STROBE_DELAY" goes LOW, causing signal "RL_STROBE" to go HIGH. This turns on n-channel transistor 328 forcing wordline 326 to go LOW from node W2 at approximately the same time as the first end of wordline 326 is being pulled LOW from node W1.

Figure 5:
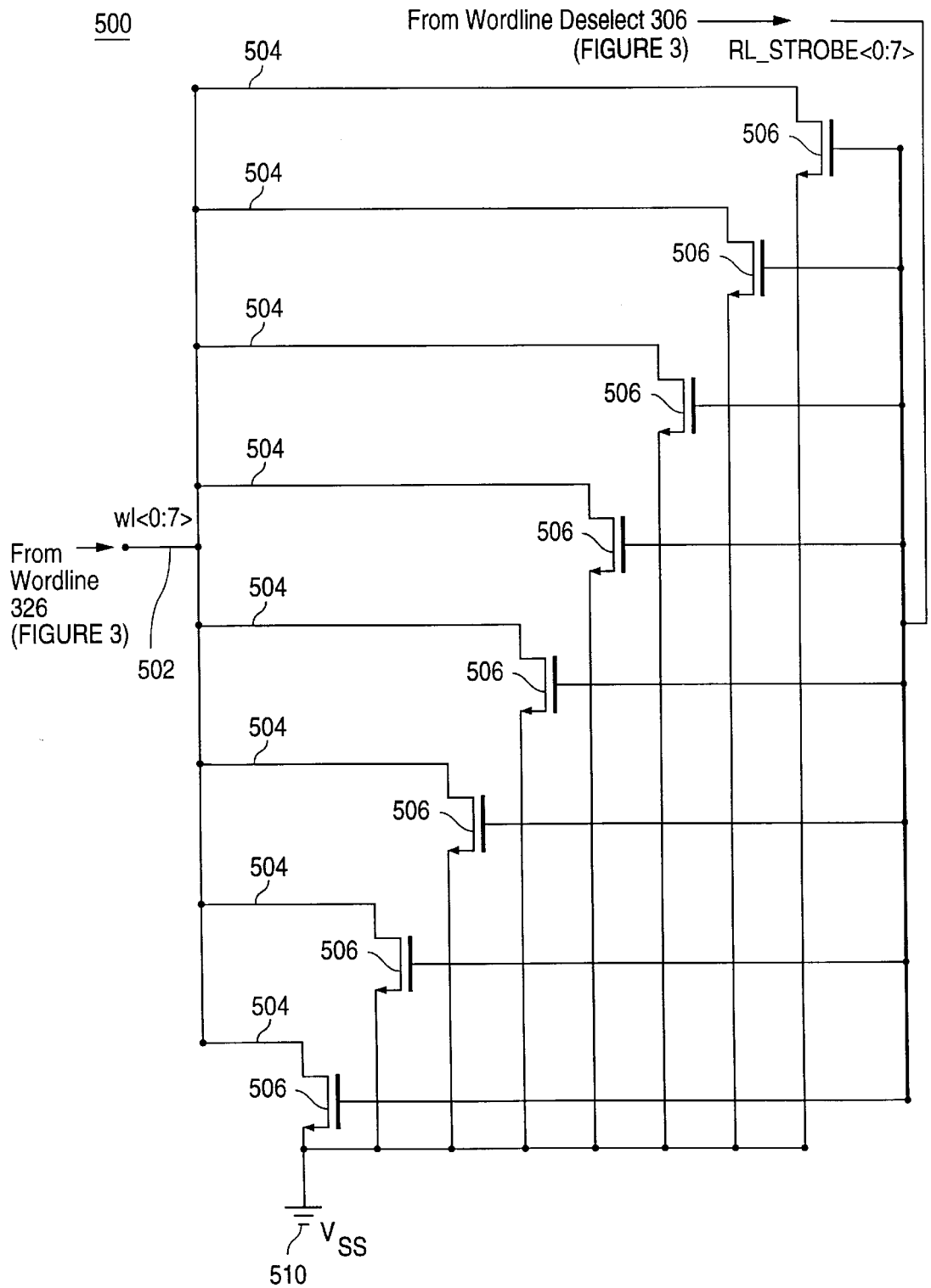
FIG. 5 shows a pulldown circuit for eight wordlines.

FIG. 5 shows a pulldown circuit for eight wordlines in a memory array. Each of the wordlines can be pulled to ground individually through its corresponding n-channel pulldown transistor. Eight "RL_STROBE" signals each driving the gate of one of the pulldown transistors is also shown in FIG. 5.

Figure 6:
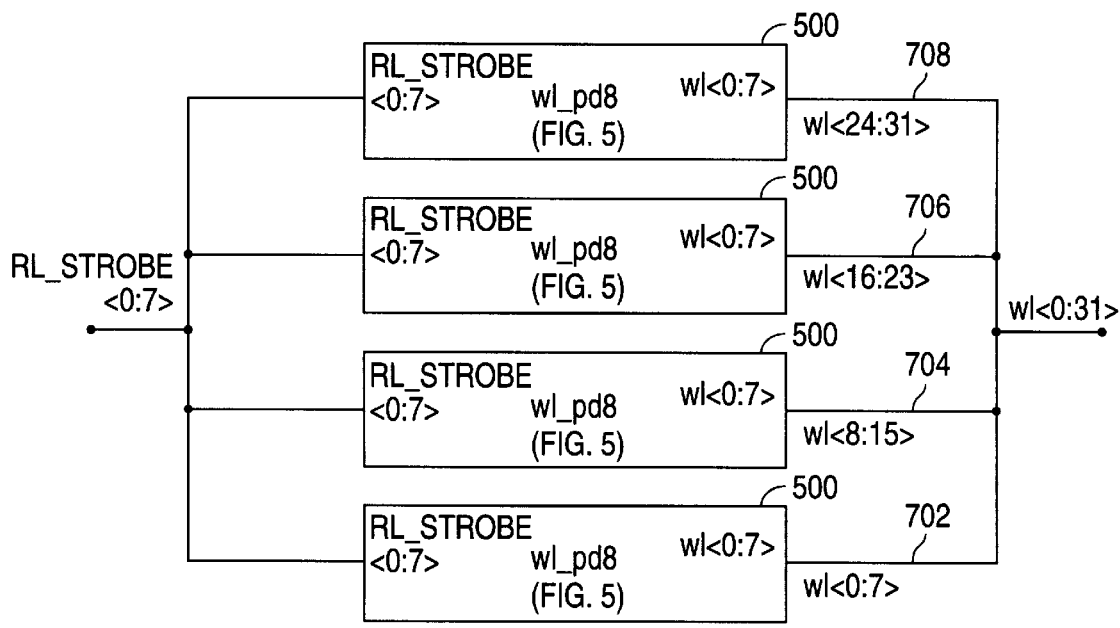
FIG. 6 shows a pulldown circuit for thirty-two wordlines using four of the pulldown circuits shown in FIG. 5.

FIG. 6 shows an arrangement of thirty-two wordlines sharing a group of eight pulldown circuits. Each one of the wl_pd8 symbols corresponds to a transistor schematic diagram shown in FIG. 5. As shown in FIG. 6, each four wordlines share a common pulldown circuit.

Figure 7:
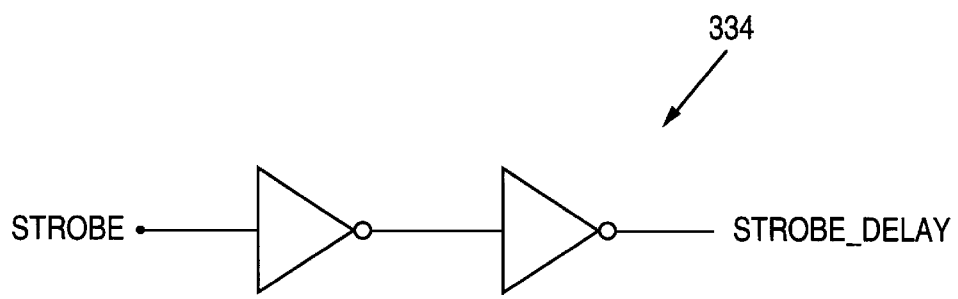
FIG. 7 shows a delay circuit formed by connecting a pair of CMOS inverters.

FIG. 7 shows an implementation of the delay circuitry. The circuit includes a pair of CMOS inverters.

An advantage of the present invention is that when a mid-cycle transition occurs (i.e., when the address changes before the end of cycle is reached) wordline 326 is pulled to LOW from both ends, therefore decreasing the read access time of the memory array.

The advantages of the strobed three-transistor wordline driver include the following:
1. The wordline is pulled down to LOW at both ends of the wordline. It is especially useful during mid-cycle transitions to pull the wordline LOW as soon as possible and therefore to allow the newly addressed wordline to be pulled HIGH more quickly.
2. Since there are only two transistors connected to node W1 of wordline 326 driver, both transistors fit the in wordline pitch.
3. Since the operation of the wordline driver and the wordline pulldown are controlled by a strobe, the operation is dynamic which allows for other events to occur such as pre-charging of the memory core and nodes.

The foregoing description of the preferred embodiment of the invention has been presented for purposes of illustration and description. It is not intended to be exhaustive or to limit the invention to the precise form disclosed. Obvious modifications or variations are possible in light of the above teachings. All such modifications and variations are within the scope of the invention as determined by the appended claims when interpreted in accordance with the breadth to which they are fairly, legally, and equitably entitled.

We claim:

1. A wordline driver for a semiconductor memory array having multiple cells arranged in rows and columns wherein each row comprises a wordline, wherein the wordline driver comprises:
   a wordline select circuit for selecting a first end of a wordline;
   a wordline deselect circuit for deselecting the first end and a second end of the wordline, said second end of the wordline being deselected at substantially the same time as the first end of the wordline is being deselected;
   an Address Transition Detector for generating an ATD pulse whenever a new address is selected; and
   a Strobe Generation Logic for generating a STROBE signal which is responsive to the ATD pulse and to a End_of_Cycle signal.

2. The wordline driver of claim 1, further comprising an Address Decode for Rows for receiving Addresses signals and the STROBE Signal and for generating in response thereto signals RL and F.

3. The wordline driver of claim 2, wherein the wordline select circuit comprises a p-channel transistor having a gate electrode for receiving signal F, a source electrode for receiving signal RL and a drain electrode connected to the first end of the wordline.

4. The wordline driver of claim 3, wherein the wordline driver deselect circuit comprises a CMOS delay circuit, a NAND circuit, a first n-channel transistor and a second n-channel transistor, wherein said CMOS delay circuit receives the STROBE signal and in response thereto generates a STROBE_DELAY signal, wherein said NAND circuit receives the RL signal and the STROBE_DELAY signal and in response thereto generates a RL_STROBE signal, wherein the drain electrode of said first n-channel transistor is connected to the first end of the wordline, the gate electrode of said first n-channel transistor receives the F signal and the source electrode of said first n-channel transistor is connected to ground, wherein the gate electrode of said second n-channel transistor is connected to an output terminal of said NAND gate, the drain electrode of said second n-channel transistor is connected to the second end of the wordline and the source electrode of said second n-channel transistor is connected to ground.

5. The wordline driver of claim 2, wherein said deselect circuit comprises a first n-channel transistor coupled to the first end of the wordline and a second n-channel transistor coupled to the second end of the wordline.

6. The wordline driver of claim 5 wherein said first n-channel transistor has a drain terminal that is coupled to the first end of the wordline, a gate terminal that receives the signal F and a source terminal that is coupled to ground.

7. The wordline driver of claim 6 wherein said deselect circuit further comprises a delay circuit and a logic circuit for delivering a signal to the second n-channel transistor.

8. The wordline driver of claim 7 wherein said delay circuit comprises a CMOS delay circuit.

9. The wordline driver of claim 8 wherein said CMOS delay circuit receives the STROBE signal and in response thereto generates a STROBE_DELAY signal.

10. The wordline driver of claim 9 wherein said logic circuit comprises a NAND circuit for receiving the RL signal and the STROBE-DELAY signal and for delivering a RL_STROBE signal to the gate terminal of the second n-channel transistor whose drain terminal is coupled to the second end of the wordline and whose source terminal is coupled to ground.

11. A method for deselecting a selected wordline in a semiconductor memory array having multiple cells arranged in rows and columns wherein each row comprises a wordline, said method comprising the steps of:
   deselecting a first end of the wordline;
   deselecting a second end of the wordline at substantially the same time as the first end of the wordline is deselected;
   detecting an address transition whenever a new address is selected and generating an ATD pulse in response thereto; and
   generating a STROBE signal in response to the ATD pulse and to an End_of_Cycle signal.

12. The method of claim 11 further comprising the step of receiving Addresses signals and the STROBE signal and for generating in response thereto signals RL and F.

13. The method of claim 12 further comprising selecting the first end of the wordline by coupling a p-channel transistor to said wordline, said p-channel transistor having a gate electrode for receiving the signal F, a source electrode for receiving the signal RL and a drain electrode connected to the first end of the wordline.

14. The method of claim 13 wherein the step of deselecting the first end of the wordline includes applying the signal F to a gate terminal of a first n-channel transistor having a drain terminal that is coupled to the first end of the wordline and a source terminal that is coupled to ground.

15. The method of claim 14 wherein the step of deselecting the second end of the wordline further includes applying the signal STROBE to a first circuit for generating a signal RL_STROBE being delivered to a gate terminal of a second n-channel transistor having a drain terminal that is coupled to the second end of the wordline and a source terminal that is coupled to ground.

16. The method of claim 15 wherein said first circuit comprises a delay circuit for receiving the signal STROBE and generating in response thereto signal STROBE_DELAY.

17. The method of claim 16 wherein said first circuit further comprises a logic circuit for receiving the RL signal and the STROBE_DELAY signal and for generating in response thereto signal RL_STROBE.

18. The method of claim 17 wherein said logic circuit includes a NAND circuit for receiving the RL signal and the STROBE_DELAY signal and for generating in response thereto signal RL_STROBE.

19. The method of claim 12 wherein the deselecting steps include deselecting the first end of the wordline and deselecting the second end of the wordline by coupling said wordline to a CMOS delay circuit, a NAND circuit, the first n-channel transistor and the second n-channel transistor, wherein said CMOS delay circuit receives the STROBE signal and in response thereto generates a STROBE_DELAY signal, wherein said NAND circuit receives the RL signal and the STROBE_DELAY signal and in response thereto generates a RL_STROBE signal, wherein the drain electrode of said first n-channel transistor is connected to the first end of the wordline, the gate electrode of said first n-channel transistor receives the F signal and the source electrode of said first n-channel transistor is connected to ground, wherein the gate electrode of said second n-channel transistor is connected to an output terminal of said NAND gate, the drain electrode of said second n-channel transistor is connected to the second end of the wordline and the source electrode of said second n-channel transistor is connected to ground.

* * * * *